(12) United States Patent
Qian et al.

(10) Patent No.: US 10,660,247 B2
(45) Date of Patent: May 19, 2020

(54) ELECTROMAGNETIC SHIELDING MODULE AND DISPLAY DEVICE

(71) Applicant: BOE TECHNOLOGY GROUP CO., LTD., Beijing (CN)

(72) Inventors: Chenfei Qian, Beijing (CN); Chao Ma, Beijing (CN); Zhicheng Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/397,179

(22) Filed: Apr. 29, 2019

(65) Prior Publication Data

US 2020/0029476 A1    Jan. 23, 2020

(30) Foreign Application Priority Data

Jul. 17, 2018    (CN) .......................... 2018 1 0785300

(51) Int. Cl.
G05D 23/20    (2006.01)
H05K 9/00    (2006.01)

(52) U.S. Cl.
CPC ....... *H05K 9/0084* (2013.01); *G05D 23/2033* (2013.01); *H05K 9/0096* (2013.01)

(58) Field of Classification Search
CPC .... G02F 1/133; G05D 23/2033; G05D 23/20; H05B 3/20; H05K 9/0084; H05K 9/0096; H05K 9/00
USPC ......................................................... 174/377
See application file for complete search history.

(56) References Cited

U.S. PATENT DOCUMENTS

2005/0073640 A1*  4/2005  Dunn ................ G02F 1/133308
349/161

FOREIGN PATENT DOCUMENTS

| CN | 2421664 | Y |   | 2/2001 | |
|---|---|---|---|---|---|
| CN | 2850900 | Y |   | 12/2006 | |
| CN | 201311629 | Y |   | 9/2009 | |
| CN | 201828889 | U |   | 5/2011 | |
| CN | 203287653 | U |   | 11/2013 | |
| CN | 203788487 | U | * | 8/2014 | ............... H05B 3/20 |
| CN | 203788487 | U |   | 8/2014 | |
| CN | 104860549 | A |   | 8/2015 | |
| CN | 205507299 | U |   | 8/2016 | |
| CN | 206178287 | U |   | 5/2017 | |
| CN | 106814486 | A |   | 6/2017 | |
| CN | 206370046 | U |   | 8/2017 | |
| CN | 207488666 | U |   | 6/2018 | |
| CN | 108901191 | A | * | 11/2018 | ......... H05K 7/20954 |
| JP | 2001210990 | A | * | 8/2002 | ............... H05K 9/00 |

OTHER PUBLICATIONS

Chinese Office Action in Chinese Application No. 201810785300.3, dated Nov. 4, 2019 with English translation.
Chinese Office Action in Chinese Application No. 201810785300.3, dated Jun. 19, 2019 with English translation.

* cited by examiner

*Primary Examiner* — Timothy J Thompson
*Assistant Examiner* — Guillermo J Egoavil
(74) *Attorney, Agent, or Firm* — Collard & Roe, P.C.

(57) ABSTRACT

An electromagnetic shielding module and a display device are disclosed. The electromagnetic shielding module includes an electromagnetic shielding film and a temperature adjusting circuit, and the temperature adjusting circuit is configured for adjusting a temperature of the electromagnetic shielding film.

20 Claims, 3 Drawing Sheets

ELECTROMAGNETIC SHIELDING MODULE AND DISPLAY DEVICE

CROSS-REFERENCE TO RELATED APPLICATIONS

The application claims priority to Chinese patent application No. 201810785300.3, filed on Jul. 17, 2018, the entire disclosure of which is incorporated herein by reference as part of the present application.

TECHNICAL FIELD

Embodiments of the present disclosure relate to an electromagnetic shielding module and a display device.

BACKGROUND

Indium tin oxide (ITO) is an oxide semiconductor. Indium tin oxide thin films can be used in military reinforced display devices. The indium tin oxide thin film forms an electromagnetic shielding layer through a coating process, which can take effect in electromagnetic shielding.

In order to ensure that the indium tin oxide thin film makes a good effect on electromagnetic shielding, the indium tin oxide thin film needs to have a certain thickness. However, as the thickness of the indium tin oxide thin film increases, the specular reflectance of the indium tin oxide thin film increases, which may affect the display effect of the reinforced display device.

SUMMARY

At least an embodiment of the present disclosure provides an electromagnetic shielding module, including an electromagnetic shielding film, and a temperature adjusting circuit configured for adjusting a temperature of the electromagnetic shielding film.

For example, the electromagnetic shielding module provided by an embodiment of the present disclosure further includes a temperature detecting circuit electrically connected with the temperature adjusting circuit, and the temperature adjusting circuit is configured to adjust the temperature of the electromagnetic shielding film according to a temperature detected by the temperature detecting circuit.

For example, in the electromagnetic shielding module provided by an embodiment of the present disclosure, the temperature detecting circuit includes a temperature sensing terminal that is in contact with the electromagnetic shielding film for detecting the temperature of the electromagnetic shielding film; the temperature adjusting circuit is configured to heat the electromagnetic shielding film if the temperature of the electromagnetic shielding film is less than a first temperature; and the temperature adjusting circuit is configured to stop heating the electromagnetic shielding film if the temperature of the electromagnetic shielding film is greater than a second temperature, and the first temperature is less than or equal to the second temperature.

For example, in the electromagnetic shielding module provided by an embodiment of the present disclosure, a value range of the first temperature is 45-55 degrees Celsius, and a value range of the second temperature is 45-55 degrees Celsius.

For example, in the electromagnetic shielding module provided by an embodiment of the present disclosure, the first temperature is 50 degrees Celsius, and the second temperature is 50 degrees Celsius.

For example, in the electromagnetic shielding module provided by an embodiment of the present disclosure, the temperature detecting circuit includes a temperature sensing terminal for detecting an ambient temperature; the temperature adjusting circuit is configured to heat the electromagnetic shielding film if the ambient temperature is less than a third temperature; and the temperature adjusting circuit is configured to stop heating the electromagnetic shielding film if the ambient temperature is greater than a fourth temperature, and the third temperature is less than or equal to the fourth temperature.

For example, in the electromagnetic shielding module provided by an embodiment of the present disclosure, a value range of the third temperature is 45-55 degrees Celsius, and a value range of the fourth temperature is 45-55 degrees Celsius.

For example, in the electromagnetic shielding module provided by an embodiment of the present disclosure, the third temperature is 50 degrees Celsius, and the fourth temperature is 50 degrees Celsius.

For example, in the electromagnetic shielding module provided by an embodiment of the present disclosure, a material of the electromagnetic shielding film includes indium tin oxide.

For example, the electromagnetic shielding module provided by an embodiment of the present disclosure further includes a resistance detecting circuit electrically connected to the electromagnetic shielding film and the temperature adjusting circuit, respectively, and is configured to detect a resistance of the electromagnetic shielding film; and the temperature adjusting circuit is configured to adjust the temperature of the electromagnetic shielding film according to the resistance detected by the resistance detecting circuit so that the resistance detected by the resistance detecting circuit is within a predetermined resistance range.

For example, in the electromagnetic shielding module provided by an embodiment of the present disclosure, the resistance detecting circuit includes a resistance detecting terminal and a resistance output terminal, the resistance detecting terminal is electrically connected with the electromagnetic shielding film, and the resistance output terminal is electrically connected with the temperature adjusting circuit.

For example, in the electromagnetic shielding module provided by an embodiment of the present disclosure, the temperature adjusting circuit is configured to heat the electromagnetic shielding film if the resistance detected by the resistance detecting circuit is greater than a first resistance value; and the temperature adjusting circuit is configured to stop heating the electromagnetic shielding film if the resistance detected by the resistance detecting circuit is less than a second resistance value, and the second resistance value is less than or equal to the first resistance value.

For example, the electromagnetic shielding module provided by an embodiment of the present disclosure further includes a conductivity detecting circuit. The conductivity detecting circuit is electrically connected to the electromagnetic shielding film and the temperature adjusting circuit, respectively, and is configured to detect a conductivity of the electromagnetic shielding film; and the temperature adjusting circuit is configured to adjust the temperature of the electromagnetic shielding film according to the conductivity detected by the conductivity detecting circuit so that the conductivity detected by the conductivity detecting circuit is within a predetermined conductivity range.

For example, in the electromagnetic shielding module provided by an embodiment of the present disclosure, the conductivity detecting circuit includes a conductivity detecting terminal and a conductivity output terminal, the conductivity detecting terminal is electrically connected with the electromagnetic shielding film, and the conductivity output terminal is electrically connected with the temperature adjusting circuit.

For example, the electromagnetic shielding module provided by an embodiment of the present disclosure further includes an antireflection layer and an underlying layer. The antireflection layer, the electromagnetic shielding film and the underlying layer are sequentially laminated.

For example, in the electromagnetic shielding module provided by an embodiment of the present disclosure, the antireflection layer uses anti-reflective glass.

For example, in the electromagnetic shielding module provided by an embodiment of the present disclosure, the temperature adjusting circuit includes an electric-heating output portion and a first electrode, the electric-heating output portion is electrically connected with the first electrode, and the first electrode is electrically connected with the electromagnetic shielding film.

For example, in the electromagnetic shielding module provided by an embodiment of the present disclosure, the electric-heating output portion includes a current output controller, and the current output controller is configured to adjust the temperature of the electromagnetic shielding film by adjusting a magnitude of current supplied to the electromagnetic shielding film.

For example, in the electromagnetic shielding module provided by an embodiment of the present disclosure, the temperature adjusting circuit further includes a second electrode, the electric-heating output portion is electrically connected with the second electrode, and the second electrode is electrically connected with the electromagnetic shielding film.

At least an embodiment of the present disclosure further provides a display device, including a display module and an electromagnetic shielding module. The electromagnetic shielding module includes an electromagnetic shielding film and a temperature adjusting circuit, the temperature adjusting circuit is configured for adjusting a temperature of the electromagnetic shielding film, and the electromagnetic shielding film is disposed on a light emitting side of the display module.

BRIEF DESCRIPTION OF THE DRAWINGS

In order to clearly illustrate the technical solution of the embodiments of the present disclosure, the drawings of the embodiments will be briefly described in the following. It is obvious that the described drawings in the following are only related to some embodiments of the present disclosure and thus are not limitative of the present disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", "coupled", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

At least an embodiment of the present disclosure provides an electromagnetic shielding module, the temperature of the electromagnetic shielding film can be adjusted by a temperature adjusting circuit, and the function of reducing the resistance value of the electromagnetic shielding film can be realized by increasing the temperature of the electromagnetic shielding film, so that a thinner electromagnetic shielding film can be selected to satisfy the requirement of electromagnetic shielding.

Figure 1:
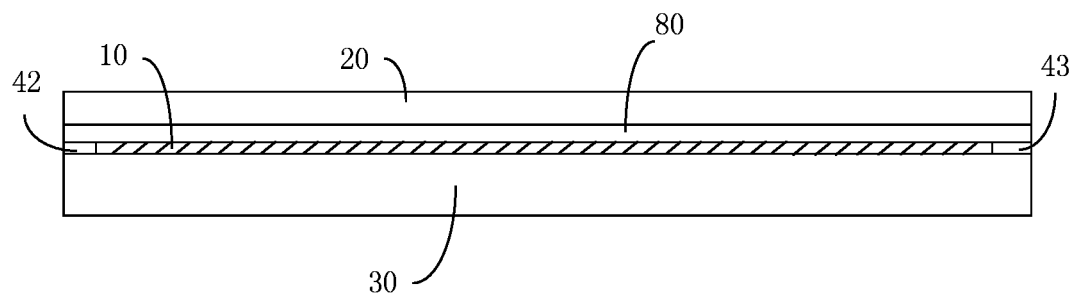
FIG. 1 is a schematic structural diagram of an electromagnetic shielding module provided by at least an embodiment of the present disclosure.

FIG. 1 is a schematic diagram of an electromagnetic shielding module provided by some embodiments of the present disclosure. As shown in FIG. 1, the electromagnetic shielding module includes an electromagnetic shielding film 10 and a temperature adjusting circuit (not shown in the figure) for adjusting a temperature of the electromagnetic shielding film.

For example, in the embodiments of the present disclosure, the material of the electromagnetic shielding film 10 may be indium tin oxide (ITO), and the present disclosure includes but is not limited to this. The material of the electromagnetic shielding film 10 may also be other materials such as tin oxide as long as the electromagnetic shielding function can be realized.

In the electromagnetic shielding module provided by the embodiments of the present disclosure, the temperature of the electromagnetic shielding film is adjusted by the temperature adjusting circuit. The resistance value of the electromagnetic shielding film can be reduced by heating the electromagnetic shielding film, and the thickness of the electromagnetic shielding film can be reduced under the condition of having the same electromagnetic shielding performance, so that the specular reflectance of the electromagnetic shielding module can be reduced. For example, in a case where the electromagnetic shielding module is configured for a display device, the requirements of electromagnetic shielding and high light transmittance of the display device can be simultaneously satisfied. For example, the electromagnetic shielding module can be used in a reinforced display device.

In some embodiments, as shown in FIG. 1, the electromagnetic shielding module further includes an antireflection layer 20 and an underlying layer 30, and the antireflection layer 20, the electromagnetic shielding film 10, and the underlying layer 30 are sequentially laminated.

For example, the underlying layer 30 may be a glass substrate, and the electromagnetic shielding film 10 may be prepared on the underlying layer 30 by a coating process.

For example, an optical adhesive 80 may be disposed between the antireflection layer 20 and the electromagnetic shielding film 10, and the antireflection layer 20 is adhered to the electromagnetic shielding film 10 through the optical adhesive 80. For example, in some embodiments, the antireflection layer 20 may use anti-reflective glass (AR glass). The anti-reflective glass is a kind of glass with single surface or double surfaces processed by special coating process, with a transmittance of over 80%, and with a reflectance of less than 3%. The anti-reflective glass has the characteristics of high light transmission in short range and slow reflection in long range, and can further reduce the specular reflectance of electromagnetic shielding film 10.

For example, the temperature adjusting circuit is an electric-heating temperature adjusting circuit. For example, the temperature adjusting circuit comprises a power supply component and a heating component. The power supply component is electrically connected with the heating component, and the power supply component is configured for supplying power to the heating component to heat the heating component. The heating component is in direct contact with the electromagnetic shielding film, or a heat conducting component can be arranged between the heating component and the electromagnetic shielding film. By increasing the temperature of the electromagnetic shielding film through the heating component, the resistance value of the electromagnetic shielding film can be reduced to satisfy the electromagnetic shielding requirements.

Figure 2:
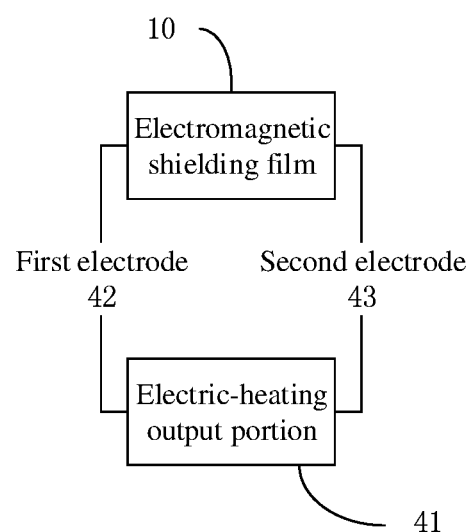
FIG. 2 is a schematic diagram of an electrical connection structure of an electromagnetic shielding module provided by at least an embodiment of the present disclosure.

For another example, as shown in FIG. 1 and FIG. 2, the temperature adjusting circuit includes an electric-heating output portion 41 and a first electrode 42. The electric-heating output portion 41 is electrically connected to the first electrode 42, and the first electrode 42 is electrically connected to the electromagnetic shielding film 10.

For example, in some embodiments, the electric-heating output portion 41 may use a current output controller that adjusts the temperature of the electromagnetic shielding film 10 by adjusting a magnitude of the current supplied to the electromagnetic shielding film 10. For example, the current output controller may output current to the electromagnetic shielding film 10 through the first electrode 42, and the electromagnetic shielding film 10 itself generates heat when the current passes through the electromagnetic shielding film 10, so that the temperature of the electromagnetic shielding film 10 can be adjusted.

For example, in other embodiments, as shown in FIG. 1 and FIG. 2, the temperature adjusting circuit may further include a second electrode 43. The electric-heating output portion 41 and the second electrode 43 are electrically connected, and the second electrode 43 and the electromagnetic shielding film 10 are electrically connected. The working efficiency of the temperature adjusting circuit can be improved by arranging two electrodes.

For example, as shown in FIG. 2, the electromagnetic shielding film 10, the first electrode 42, the electric-heating output portion 41, and the second electrode 43 are connected in series. For example, the first electrode 42 and the second electrode 43 may be disposed at the peripheral area of the electromagnetic shielding film 10, a first electrode terminal of the electric-heating output portion 41 is electrically connected to the first electrode 42, and a second electrode terminal of the electric-heating output portion 41 is electrically connected to the second electrode 43.

For example, the first electrode 42 and the second electrode 43 may be silver wires respectively disposed on both sides of the electromagnetic shielding film 10. Different types of electromagnetic shielding modules can set the adjustment value of the temperature adjusting circuit to the temperature of the electromagnetic shielding film 10 as required to satisfy different electromagnetic shielding requirements.

During actual use, the electromagnetic shielding module may be affected by the ambient temperature, which may change at any time, thus leading to unstable electromagnetic shielding performance of the electromagnetic shielding module.

Figure 3:
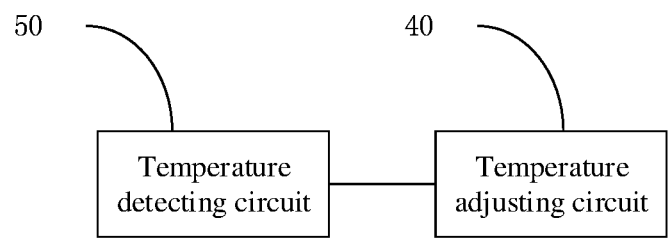
FIG. 3 is a schematic diagram of an electrical connection structure of a specific electromagnetic shielding module provided by at least an embodiment of the present disclosure.

As shown in FIG. 3, in some embodiments of the present disclosure, the electromagnetic shielding module further includes a temperature detecting circuit 50. The temperature detecting circuit 50 is electrically connected to the temperature adjusting circuit 40, and the temperature adjusting circuit 40 adjusts the temperature of the electromagnetic shielding film 10 according to a temperature detected by the temperature detecting circuit 50, which is more conducive to keeping the electromagnetic shielding performance of the electromagnetic shielding film 10 stable.

For example, in some embodiments, the temperature detecting circuit 50 includes a temperature sensing terminal for detecting the ambient temperature. For example, the temperature sensing terminal of the temperature detecting circuit 50 is exposed outside the outer surface of the electromagnetic shielding module, or is in direct contact with the outer surface of the electromagnetic shielding module, etc.

For example, in the case where the temperature sensing terminal of the temperature detecting circuit 50 is used to detect the ambient temperature, the temperature adjusting circuit 40 is configured to heat the electromagnetic shielding film 10 if the ambient temperature is less than a third temperature, and is configured to stop heating the electromagnetic shielding film 10 if the ambient temperature is greater than a fourth temperature, and the third temperature is less than or equal to the fourth temperature.

For example, in some embodiments, a value range of the third temperature is 45-55 degrees Celsius. A value range of the fourth temperature is 45-55 degrees Celsius. For example, the third temperature and the fourth temperature are both set to 50 degrees Celsius. In other words, when the ambient temperature is lower than 50 degrees Celsius, the temperature adjusting circuit 40 heats the electromagnetic shielding film 10 to ensure the impedance requirements of the electromagnetic shielding film 10, so that the electromagnetic shielding film 10 satisfies the electromagnetic shielding performance requirements. When the ambient temperature is higher than 50 degrees Celsius, the temperature adjusting circuit 40 stops heating the electromagnetic shielding film 10, and the electromagnetic shielding film 10 affected by the ambient temperature can satisfy the requirements of impedance and the requirements of electromagnetic shielding performance.

It is easy to understand that the temperature detecting circuit 50 is not limited to detecting the ambient temperature. For example, in some other embodiments of the present disclosure, the temperature sensing terminal of the temperature detecting circuit 50 is in contact with the electromagnetic shielding film 10 for detecting the temperature of the electromagnetic shielding film 10.

For example, in the case where the temperature sensing terminal of the temperature detecting circuit 50 is used to detect the temperature of the electromagnetic shielding film 10, the temperature adjusting circuit 40 is configured to heat the electromagnetic shielding film 10 if the temperature of the electromagnetic shielding film 10 is less than a first temperature, and is configured to stop heating the electromagnetic shielding film 10 if the temperature of the electromagnetic shielding film 10 is greater than a second temperature, and the first temperature is less than or equal to the second temperature.

For example, in some embodiments, a value range of the first temperature is 45-55 degrees Celsius, and a value range of the second temperature is 45-55 degrees Celsius. For example, the first temperature is 50 degrees Celsius, and the second temperature is 50 degrees Celsius. The embodiments of the present disclosure include, but are not limited thereto, and the values of the first temperature and the second temperature may be determined according to the electromagnetic shielding requirements of the electromagnetic shielding module.

Figure 4:
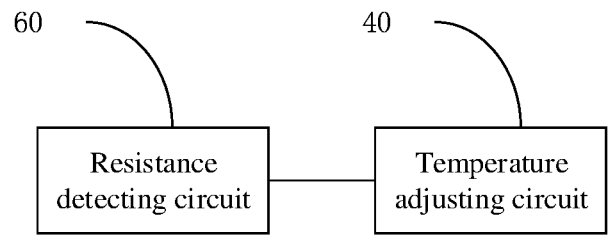
FIG. 4 is a schematic diagram of an electrical connection structure of another specific electromagnetic shielding module provided by at least an embodiment of the present disclosure.

In addition to the controlling method of temperature detection, the present disclosure also provides some other embodiments. As shown in FIG. 4, the electromagnetic shielding module further includes a resistance detecting circuit 60. The resistance detecting circuit 60 is electrically connected to the electromagnetic shielding film 10 and the temperature adjusting circuit 40, respectively, and is configured to detect the resistance of the electromagnetic shielding film 10. In these embodiments, the temperature adjusting circuit 40 is further configured to adjust the temperature of the electromagnetic shielding film 10 according to the resistance detected by the resistance detecting circuit 60 so that the resistance detected by the resistance detecting circuit 60 is within a predetermined resistance range.

For example, in some embodiments, the resistance detecting circuit 60 includes a resistance detecting terminal electrically connected to the electromagnetic shielding film 10 and a resistance output terminal electrically connected to the temperature adjusting circuit 40. The temperature adjusting circuit 40 performs temperature adjustment according to the resistance detected by the resistance detecting circuit 60 so that the resistance detected by the resistance detecting circuit 60 is within the predetermined resistance range. For example, the temperature adjusting circuit 40 is configured to heat the electromagnetic shielding film 10 if the resistance detected by the resistance detecting circuit 60 is greater than a first resistance value, and is configured to stop heating the electromagnetic shielding film 10 if the resistance detected by the resistance detecting circuit 60 is less than a second resistance value, and the second resistance value is less than or equal to the first resistance value.

Figure 5:
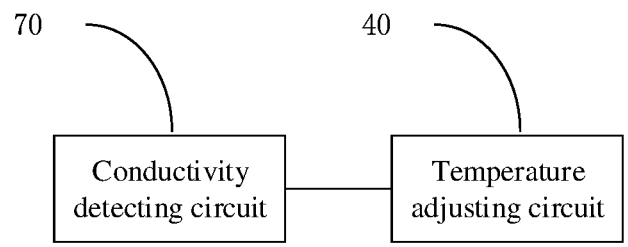
FIG. 5 is a schematic diagram of an electrical connection structure of further still another specific electromagnetic shielding module provided by at least an embodiment of the present disclosure.

As shown in FIG. 5, the electromagnetic shielding module provided by some other embodiments of the present disclosure further includes a conductivity detecting circuit 70. The conductivity detecting circuit 70 is electrically connected to the electromagnetic shielding film 10 and the temperature adjusting circuit 40, respectively, and is configured to detect the conductivity of the electromagnetic shielding film 10. In these embodiments, the temperature adjusting circuit 40 is further configured to adjust the temperature of the electromagnetic shielding film 10 according to the conductivity detected by the conductivity detecting circuit 70 so that the conductivity detected by the conductivity detecting circuit 70 is within a predetermined conductivity range.

For example, in some embodiments, the conductivity detecting circuit 70 includes a conductivity detecting terminal and a conductivity output terminal. The conductivity detecting terminal is electrically connected with the electromagnetic shielding film 10 for detecting the conductivity of the electromagnetic shielding film 10, the conductivity output terminal of the conductivity detecting circuit 70 is electrically connected with the temperature adjusting circuit 40, and the temperature adjusting circuit 40 performs temperature adjustment according to the conductivity detected by the conductivity detecting circuit 70 to adjust the conductivity detected by the conductivity detecting circuit 70 to the predetermined conductivity range.

Figure 6:
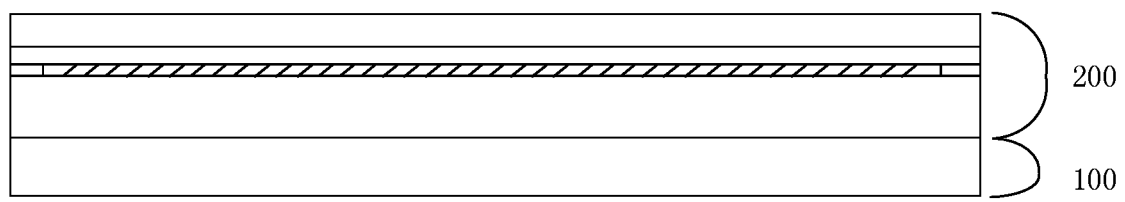
FIG. 6 is a schematic structural diagram of a display device provided by at least an embodiment of the present disclosure.

At least an embodiment of the present disclosure also provides a display device. As shown in FIG. 6, the display device includes a display module 100 and an electromagnetic shielding module 200, the electromagnetic shielding module 200 includes an electromagnetic shielding film 10 and a temperature adjusting circuit 40, and the temperature adjusting circuit 40 is configured for adjusting a temperature of the electromagnetic shielding film 10. The electromagnetic shielding film 10 is disposed on a light emitting side of the display module 100. It should be noted that the description of the electromagnetic shielding module can refer to the corresponding description in the above-mentioned embodiments and will not be repeated here.

The electromagnetic shielding film 10 forms electromagnetic shielding for the display module 100. In use, the temperature of the electromagnetic shielding film 10 of the electromagnetic shielding module is adjusted by the temperature adjusting circuit 40, and the resistance value of the electromagnetic shielding film 10 is reduced by heating the electromagnetic shielding film 10, so that the electromagnetic compatibility performance index of the display module 100 can be satisfied. Under the condition of having the same electromagnetic shielding performance, the thickness of the electromagnetic shielding film 10 can be reduced, so that the specular reflectance of the display device can be reduced, and the electromagnetic shielding and high light transmittance requirements of the display device can be simultaneously satisfied.

For example, the display device can be any product or component with display function, such as a military reinforced display device, a display panel, an electronic paper, a mobile phone, a tablet computer, a television, a display screen, a notebook computer, a digital photo frame, a navigator, etc.

Figure 7:
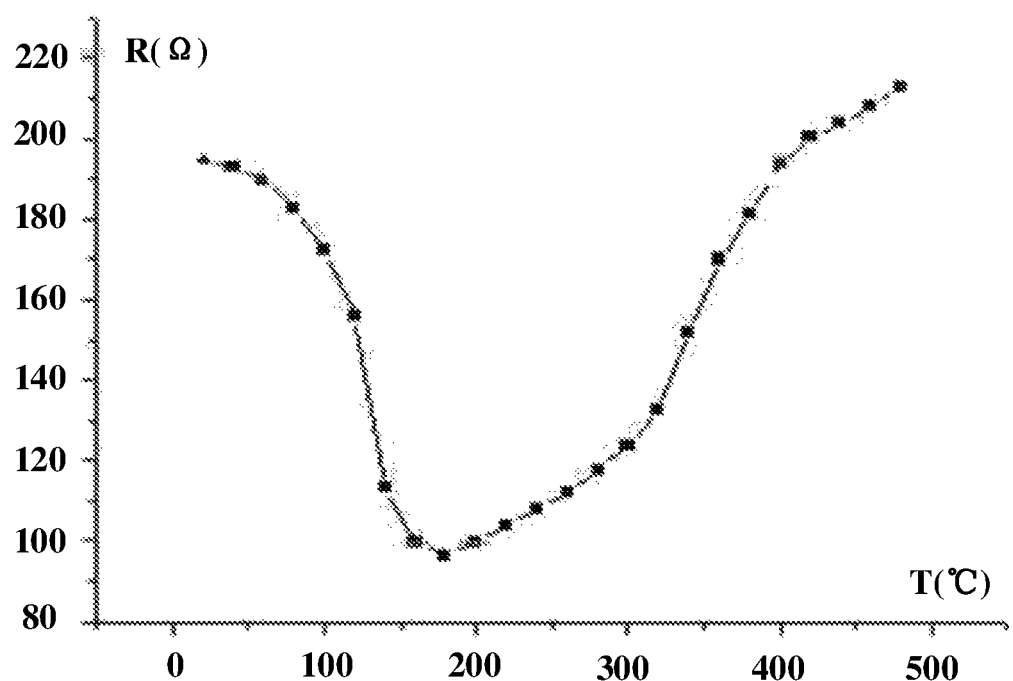
FIG. 7 is a graph showing a relationship between resistance and temperature of an electromagnetic shielding film provided by at least an embodiment of the present disclosure.

FIG. 7 is a graph showing a relationship between the resistance R of the electromagnetic shielding film 10 and the temperature T of the electromagnetic shielding film 10 in the embodiments of the present disclosure, the abscissa is the temperature T, and the ordinate is the resistance R. As illustrated in FIG. 7, it can be seen that the resistance of the electromagnetic shielding film 10 decreases with the increase of the temperature in the range of 0-180 degrees Celsius. In a case where the temperature of the display device is in the range of 0-180 degrees Celsius, increasing the temperature of the electromagnetic shielding film 10 can reduce the resistance of the electromagnetic shielding film 10, so that the electromagnetic compatibility performance index of the display device can be satisfied under the condition of reducing the thickness of the electromagnetic shielding film 10.

What have been described above are only specific implementations of the present disclosure, the protection scope of the present disclosure is not limited thereto, and the protection scope of the present disclosure should be based on the protection scope of the claims.

What is claimed is:

1. An electromagnetic shielding module, comprising:
    an electromagnetic shielding film,
    a temperature adjusting circuit, an antireflection layer and an underlying layer,
    wherein the temperature adjusting circuit is configured for adjusting a temperature of the electromagnetic shielding film; and
    the antireflection layer, the electromagnetic shielding film and the underlying layer are sequentially laminated.

2. The electromagnetic shielding module according to claim 1, further comprising a temperature detecting circuit,
    wherein the temperature detecting circuit is electrically connected with the temperature adjusting circuit, and the temperature adjusting circuit is configured to adjust the temperature of the electromagnetic shielding film according to a temperature detected by the temperature detecting circuit.

3. The electromagnetic shielding module according to claim 2, wherein the temperature detecting circuit comprises a temperature sensing terminal, and the temperature sensing terminal is in contact with the electromagnetic shielding film and is configured for detecting the temperature of the electromagnetic shielding film; and
    the temperature adjusting circuit is configured to heat the electromagnetic shielding film in a case where the temperature of the electromagnetic shielding film is less than a first temperature, and is configured to stop heating the electromagnetic shielding film in a case where the temperature of the electromagnetic shielding film is greater than a second temperature, and
    the first temperature is less than or equal to the second temperature.

4. The electromagnetic shielding module according to claim 3, wherein a value range of the first temperature is 45-55 degrees Celsius, and a value range of the second temperature is 45-55 degrees Celsius.

5. The electromagnetic shielding module according to claim 4, wherein the first temperature is 50 degrees Celsius, and the second temperature is 50 degrees Celsius.

6. The electromagnetic shielding module according to claim 2, wherein the temperature detecting circuit comprises a temperature sensing terminal configured for detecting an ambient temperature; and
    the temperature adjusting circuit is configured to heat the electromagnetic shielding film in a case where the ambient temperature is less than a third temperature, and is configured to stop heating the electromagnetic shielding film in a case where the ambient temperature is greater than a fourth temperature, and the third temperature is less than or equal to the fourth temperature.

7. The electromagnetic shielding module according to claim 6, wherein a value range of the third temperature is 45-55 degrees Celsius, and a value range of the fourth temperature is 45-55 degrees Celsius.

8. The electromagnetic shielding module according to claim 7, wherein the third temperature is 50 degrees Celsius, and the fourth temperature is 50 degrees Celsius.

9. The electromagnetic shielding module according to claim 1, wherein a material of the electromagnetic shielding film comprises indium tin oxide.

10. The electromagnetic shielding module according to claim 1, further comprising a resistance detecting circuit,
    wherein the resistance detecting circuit is electrically connected to the electromagnetic shielding film and the temperature adjusting circuit, respectively, and is configured to detect a resistance of the electromagnetic shielding film; and
    the temperature adjusting circuit is configured to adjust the temperature of the electromagnetic shielding film according to the resistance detected by the resistance detecting circuit so that the resistance detected by the resistance detecting circuit is within a predetermined resistance range.

11. The electromagnetic shielding module according to claim 10, wherein the resistance detecting circuit comprises a resistance detecting terminal and a resistance output terminal, the resistance detecting terminal is electrically connected with the electromagnetic shielding film, and the resistance output terminal is electrically connected with the temperature adjusting circuit.

12. The electromagnetic shielding module according to claim 10, wherein the temperature adjusting circuit is configure to heat the electromagnetic shielding film in a case where the resistance detected by the resistance detecting circuit is greater than a first resistance value, and is configured to stop heating the electromagnetic shielding film in a case where the resistance detected by the resistance detecting circuit is less than a second resistance value, and
    the second resistance value is less than or equal to the first resistance value.

13. The electromagnetic shielding module according to claim 1, further comprising a conductivity detecting circuit,
    wherein the conductivity detecting circuit is electrically connected to the electromagnetic shielding film and the temperature adjusting circuit, respectively, and is configured to detect a conductivity of the electromagnetic shielding film; and
    the temperature adjusting circuit is configured to adjust the temperature of the electromagnetic shielding film according to the conductivity detected by the conductivity detecting circuit so that the conductivity detected by the conductivity detecting circuit is within a predetermined conductivity range.

14. The electromagnetic shielding module according to claim 13, wherein the conductivity detecting circuit comprises a conductivity detecting terminal and a conductivity output terminal, the conductivity detecting terminal is electrically connected with the electromagnetic shielding film, and the conductivity output terminal is electrically connected with the temperature adjusting circuit.

15. The electromagnetic shielding module according to claim 1, wherein the antireflection layer comprises anti-reflective glass.

16. The electromagnetic shielding module according to claim 1, wherein the temperature adjusting circuit comprises an electric-heating output portion and a first electrode; and
the electric-heating output portion is electrically connected with the first electrode, and the first electrode is electrically connected with the electromagnetic shielding film.

17. The electromagnetic shielding module according to claim 16, wherein the electric-heating output portion comprises a current output controller, and the current output controller is configured to adjust the temperature of the electromagnetic shielding film by adjusting a magnitude of current supplied to the electromagnetic shielding film; and
the temperature adjusting circuit further comprises a second electrode, the electric-heating output portion is electrically connected with the second electrode, and the second electrode is electrically connected with the electromagnetic shielding film.

18. A display device, comprising a display module and an electromagnetic shielding module,
wherein the electromagnetic shielding module comprises an electromagnetic shielding film and a temperature adjusting circuit, the temperature adjusting circuit is configured for adjusting a temperature of the electromagnetic shielding film, and
the electromagnetic shielding film is on a light emitting side of the display module.

19. An electromagnetic shielding module, comprising:
an electromagnetic shielding film;
a temperature adjusting circuit configured for adjusting a temperature of the electromagnetic shielding film; and
a temperature detecting circuit,
wherein the temperature detecting circuit is electrically connected with the temperature adjusting circuit, and the temperature adjusting circuit is configured to adjust the temperature of the electromagnetic shielding film according to a temperature detected by the temperature detecting circuit;
the temperature detecting circuit comprises a temperature sensing terminal; and
the temperature adjusting circuit is configured to heat the electromagnetic shielding film in a case where a temperature detected by the temperature sensing terminal is less than a first temperature, and is configured to stop heating the electromagnetic shielding film in a case where a temperature detected by the temperature sensing terminal is greater than a second temperature, and the first temperature is less than or equal to the second temperature.

20. The electromagnetic shielding module according to claim 19, wherein the temperature sensing terminal is in contact with the electromagnetic shielding film and is configured for detecting the temperature of the electromagnetic shielding film; or
the temperature sensing terminal is configured for detecting an ambient temperature.

* * * * *